US009058883B2

(12) United States Patent
Uematsu et al.

(10) Patent No.: US 9,058,883 B2
(45) Date of Patent: Jun. 16, 2015

(54) CONTROL APPARATUS FOR CONTROLLING DATA READING AND WRITING TO FLASH MEMORY

(75) Inventors: Nobuya Uematsu, Kariya (JP); Tsuneo Yamamoto, Nagoya (JP)

(73) Assignee: DENSO CORPORATION, Kariya (JP)

( * ) Notice: Subject to any disclaimer, the term of this patent is extended or adjusted under 35 U.S.C. 154(b) by 298 days.

(21) Appl. No.: 13/401,033

(22) Filed: Feb. 21, 2012

(65) Prior Publication Data

US 2012/0215968 A1 Aug. 23, 2012

(30) Foreign Application Priority Data

Feb. 23, 2011 (JP) .................................. 2011-037075

(51) Int. Cl.
G11C 29/00 (2006.01)
G11C 16/34 (2006.01)
G11C 16/16 (2006.01)
G06F 12/02 (2006.01)

(52) U.S. Cl.
CPC ............ *G11C 16/16* (2013.01); *G11C 16/3445* (2013.01); *G06F 2212/7205* (2013.01); *G06F 12/0246* (2013.01); *G11C 29/82* (2013.01)

(58) Field of Classification Search
CPC .............. G06F 12/0246; G06F 3/0679; G06F 2212/2022; G06F 2212/7211; G06F 2212/72; G11C 16/02; G11C 16/3445; G11C 29/70; G11C 28/816; G11C 29/82
USPC ......................................................... 711/103
See application file for complete search history.

(56) References Cited

U.S. PATENT DOCUMENTS

| 6,388,919 | B2 * | 5/2002 | Terasaki ................... 365/185.09 |
| 7,295,479 | B2 * | 11/2007 | Yoon et al. .................... 365/200 |
| 2002/0026566 | A1 * | 2/2002 | Awada et al. ................. 711/162 |
| 2005/0162947 | A1 | 7/2005 | Kim et al. |
| 2005/0185482 | A1 | 8/2005 | Sugimoto et al. |
| 2010/0262765 | A1 * | 10/2010 | Cheon et al. .................. 711/103 |

FOREIGN PATENT DOCUMENTS

JP 2000-243093 9/2000
JP 2001-312891 11/2001

(Continued)

OTHER PUBLICATIONS

Office action dated Nov. 12, 2013 in corresponding Japanese Application No. 2011-037075.

*Primary Examiner* — Charles Rones
*Assistant Examiner* — Andrew Russell
(74) *Attorney, Agent, or Firm* — Harness, Dickey & Pierce, PLC

(57) ABSTRACT

To record data in a flash memory, upon detecting that a current destination memory block is full, a control apparatus records data in a destination memory block one block by one block, with "in-advance" data erasure of the next memory block and by determining if data erasure of the next memory block is successful. When data erasure of the next memory block fails, such memory block is designated as broken, and such memory block is excluded from a group of blocks to be used as recording destination. After determining the data erasure result of a yet-next memory block is successful, the required data is copied to the yet-next memory block. Therefore, even when one of the blocks is broken, a sequential data recording in the flash memory is performed without increasing the number of data copy operations between blocks.

1 Claim, 8 Drawing Sheets

(56) References Cited

FOREIGN PATENT DOCUMENTS

| | | |
|---|---|---|
| JP | 2005-107600 | 4/2005 |
| JP | 2005-216293 | 8/2005 |
| JP | 2008-146255 | 6/2008 |
| JP | 2009-288914 | 12/2009 |
| WO | WO 2005/081261 | 9/2005 |

* cited by examiner

CONTROL APPARATUS FOR CONTROLLING DATA READING AND WRITING TO FLASH MEMORY

CROSS REFERENCE TO RELATED APPLICATION

The present application is based on and claims the benefit of priority of Japanese Patent Application No. 2011-37075, filed on Feb. 23, 2011, the disclosure of which is incorporated herein by reference.

TECHNICAL FIELD

The present disclosure generally relates to a control apparatus for controlling data writing and reading to and from a flash memory.

BACKGROUND

Conventionally, a flash memory is known for having a block that serves as a minimum unit of data erasure, and a plurality of such blocks are provided in one flash memory. Further, a control apparatus for controlling such flash memory performs, as a control of data reading/writing operation, data erasure in one block to use that block as a new data recording destination block for recording data, and copies, as required data, a part of data in a previous data recording destination block to a current destination block. Thereafter, upon having a new data writing request, data is written to the new data recording destination block of the flash memory.

Further, Japanese Patent Laid-Open No. 2005-216293 (JP '293) discloses a technique that, if recording of data to the current destination block results in failure, the current destination block is considered as "broken". In such technique, a block next to the current destination block is used as a new destination of data recording after data erasure, which then serves as the current destination block for subsequent data recording. Then, such technique copies a part of the data in the previous destination block to the current destination block as the required data, and avoids the use of the now "previous" destination block, which has already been determined as broken.

However, in the above-described technique of (JP '293), a broken block will not be detected until the data writing to a certain block results in failure. Therefore, the number of times data is copied from one block to the other is increased. For example, assume that a block A capable of recording about 1000 pieces of data has trouble and writing of the 100th data fails. In such a case, the block A of the flash memory will not be detected as broken until the data writing of the 100th data fails that comes after the writing of the first data to the 99th data, and required data is copied from the block A to the next block, which may be a block B. As a result, data copy is performed earlier than expected at a time of data writing of the 100th data, that is, earlier than at a time of data writing of the 1000th data. That is, the number of times of an inter-block copy operation, or a data copy frequency, is increased, which results in the increase of the process load of the control apparatus.

SUMMARY

It is an object of the present disclosure to provide a control apparatus, which is configured to perform a data recording control of (i) erasing data in the next block to use the next block as a new data recording destination block and (ii) copying a part of data in a previous data recording destination block to the new data recording destination block as required data, which then serves as a current data recording destination block for subsequent data recording, for the purpose of preventing an increase in the frequency of the inter-block copy operations even when a destination block is found as broken.

In an aspect of the present disclosure, the control apparatus reads data from and writes data to a plurality of blocks in a flash memory, which serve as a unit of data erasure. The control apparatus may include an erase check unit and a valid data copy unit, The erase check unit may select a next block that is next to and different from a current data recording destination block, and initiate an erase instruction to erase the data in the next block. The erase check unit then determines whether the data erasure in the next block was successful or unsuccessful (i.e. failed).

Based on a determination of the erase check unit that the data erasure in the next block is successful, the valid data copy designates the next block as a new data recording destination block, and copies a part of a plurality of data records from a previous data recording destination block to the new data recording destination block, and the new data recording destination block becomes the current data recording destination block.

Based on a determination that the data erasure of the next block has failed, the erase check unit designates that the next block is broken, and the erase check unit further searches for and selects a yet-next block next to the next block. The erase check unit may then initiate an erase instruction to erase the data in the yet-next block, and checks whether the data erasure in the yet-next block is successful or unsuccessful. Based on a determination of the erase check unit that the data erasure of the next block is successful, the valid data copy unit designates the yet-next block as the new data recording destination block.

As described above, the control apparatus of the present disclosure detects and designates that the next block is broken before writing data to the next block by checking the result of an attempt of the data erasure in the next block, and further determines and designates a yet-next block that is next to the next block as a new data recording destination by checking the result of an attempt of the data erasure in the yet-next block, thereby enabling a skip of data copy operation to the next block, which is broken. The control apparatus of the present disclosure detects a block as being broken earlier, that is, before actually writing data to the broken block. The earlier detection of the broken block may save time to copy data from the broken block to the normal block, thereby preventing an increase of the inter-block copy frequency caused by the defects of the blocks.

By redefining a group of useable blocks to include a reserve block that has not been designated as one of usable blocks when a certain block is detected to be broken, data processing may continue without decreasing the number of usable blocks, and the record writing is more securely performed by adding a less-used (i.e., not-so-frequently-used) block to the usable blocks.

In addition to the above configuration, the erasure check unit of the control apparatus in the present disclosure may determine that the next block is broken based on the failure of the data erasure in the next block, and selects a yet-next block from among the reserve blocks that are used only when a block is broken. The erasure check unit attempts the data erasure in the selected yet-next block, and checks a result of the data erasure in the yet-next block, that is, determines whether the data erasure was successful or failed.

As described above, even when a certain block is determined as broken, the reserve block is regrouped and used for the continuation of the data processing without decreasing the number of usable blocks. Further, the data writing is more securely performed to a less-frequently used reserve block.

In addition to the above configuration, the plurality of blocks in the flash memory of the control apparatus are grouped into plural areas for classifying the data records according to data types in the data records. The erase check unit selects the next block from blocks from a group of blocks belonging to the data recording destination block area, and performs the data erasure to erase data in the selected next block. The erase check unit determines whether the data erasure in the next block was successful or unsuccessful, and determines that the next block is broken if the data erasure in the next block was unsuccessful. Further, the erase check unit selects the yet-next block from reserve blocks that belong to the data recording destination block area and that are used only when a block is broken. The erase check unit performs the data erasure to erase data in the selected yet-next block and determines whether the data erasure in the yet-next block was successful or failed.

As described above, by using one of the plural block areas of the recording destination blocks as a group of the reserve blocks, the reserve blocks are more securely reserved as a stock of available and usable blocks in a certain recording destination block area.

In addition to the above configuration, the plurality of blocks in the flash memory of the control apparatus are grouped into plural areas for classifying the records according to data types in the data records, and the erase check unit selects the next block from a group of blocks belonging to the recording destination block area, and performs the data erasure attempt to erase data in the selected next block and to see whether the data erasure in the next block has been successful or failed, and determines that the next block is broken if the data erasure in the next block has been successful or failed. Further, the erase check unit selects the yet-next block from reserve blocks in a reserve block area that does not belong to any other block area, and performs the data erasure to erase data in the selected yet-next block, and determines whether the data erasure in the yet-next block was successful or failed.

As described above, when it is determined that a block is broken, the data processing can be continued without decreasing the number of usable blocks by including the reserve block in a group of the usable blocks. Further, the record writing to the reserve block is more securely performed by using a less-frequently used block as the reserve block. Further, by reserving a group of blocks for plural recording destination areas, that is, by using blocks in a reserve block area in a shared manner, the versatility of the reserve blocks is improved.

In addition to the above configuration, the plurality of blocks in the flash memory of the control apparatus are grouped into plural areas for classifying recording destinations of data records according to data types in the data records, and the erase check unit selects the next block from a group of blocks belonging to the data recording destination block area among the plural areas, and performs the data erasure to erase data in the selected next block and determines whether the data erasure in the next block was successful or failed. When the data erasure in the next block has failed, the erase check unit determines that the next block is broken, and the erase check unit excludes the broken block from the group of blocks in the data recording destination block area. Further, the erase check unit selects the yet-next block from replacement blocks in a replacement block area which is designated as having a lowest data recording frequency among the plural block areas, includes the selected yet-next block in the group of blocks in the recording destination block areas, excludes the selected yet-next block from a group of blocks in the replacement block area, copies a part of currently-recorded records in the selected yet-next block to a determined-as-broken block, includes the determined-as-broken block in the group of blocks in the replacement block area, and performs the data erasure to erase data in the selected yet-next block, and determines whether the data erasure in the yet-next block was successful or failed.

As described above, when a block currently included in a block group serving as the recording destination block area is detected as broken, by selecting a block from the scarcely updated/recorded replacement block area which is designated as having the lowest data recording frequency and including such block in the recording destination block area, and by further including the broken block in the scarcely updated/recorded replacement block area, frequently updated data is recorded in a block that is less likely to be broken and that has fewer number of data writing and data erasure, while the data that is required to have a relatively small memory area due to a lower update frequency is recorded in a block that is determined as broken, for the purpose of improving the efficiency of the use of the memory blocks. Further, in the present embodiment, there may be no reserve area, and there may be no reserve blocks.

BRIEF DESCRIPTION OF THE DRAWINGS

Objects, features, and advantages of the present disclosure will become more apparent from the following detailed description made with reference to the accompanying drawings, in which.

DETAILED DESCRIPTION

First Embodiment

Figure 1:
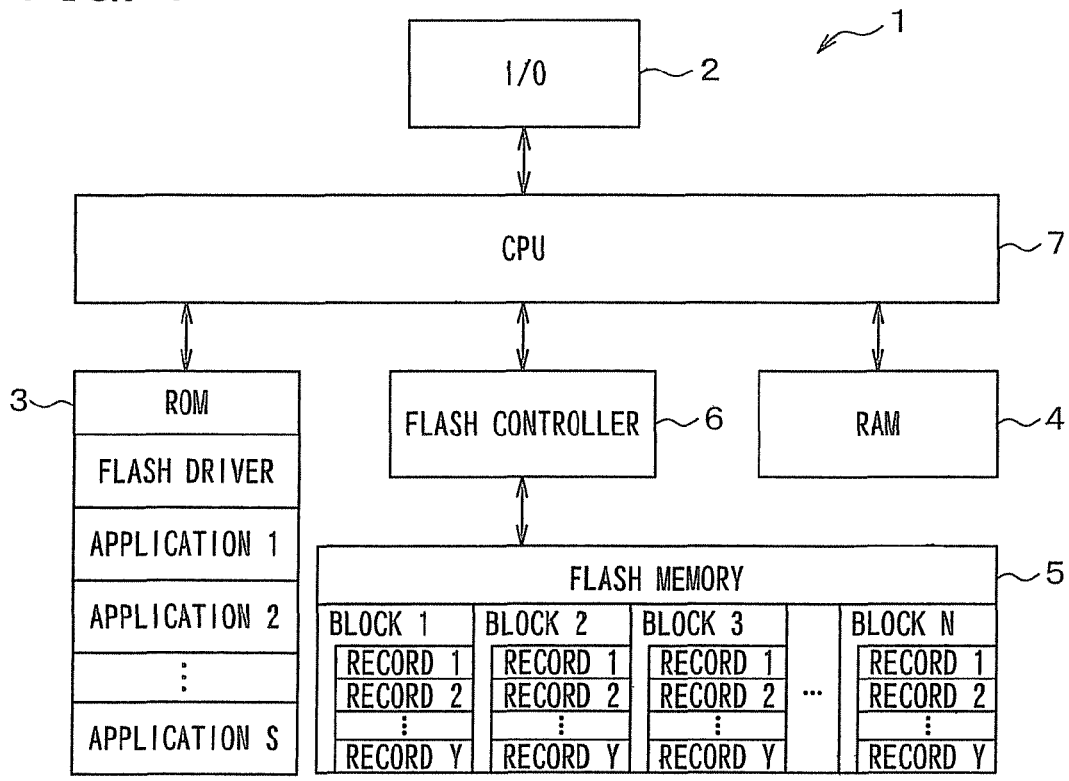
FIG. 1 is a block diagram of a microcontroller in a first embodiment of the present disclosure.

The first embodiment of the present disclosure is explained as follows. With reference to FIG. 1, a microcontroller 1, disposed in a vehicle (not shown), includes an I/O 2, ROM 3, RAM 4, a flash memory 5, a flash controller 6, and CPU 7.

The I/O 2 is an interface device to exchange signals with an outside device of the microcontroller 1. ROM 3 is a nonvolatile storage medium that memorizes various programs to be executed by CPU 7. RAM 4 is a memory serving as a work area of CPU 7.

The flash memory 5 consists of a plurality of blocks or N number of blocks, (e.g., three or more blocks in the present embodiment), which respectively serve as a minimum unit of data erasure. The size of each block is several kilobytes (e.g., 4 Kbytes), and, when a certain data in one block is erased, the data of the entire block has to be erased. That is, in other words, data bit in the entire block is changed to '1.' However, when a specific bit in one block is rewritten from '1' to '0,' the data is written by a unit of 2 bytes or a unit of 4 bytes, depending on the hardware, or a microcomputer.

The CPU 7 and the flash controller 6 use the plurality of blocks by block by block, that is, one after the other in a sequential order, starting from a block 1 in the first position. Such that, when data is written to the plurality of blocks, the block 1 is used first, then after the use of the block 1 is finished, a block 2 is used next, then a block 3, and so on. For example, with reference to FIG. 4 steps (1)-(14), when block 1 is full in (3), the CPU 7 continues to block 2 in (4), when block 2 is full the CPU 7 moves to block 3 in (6). When block 3 is full the CPU 7 returns to block 1, and so on.

Each block is configured to include a header field and a data field. Based on information recorded in the header field of a block, whether the block is currently being used or is not being used can be determined. In other words, information indicative of a condition that a subject block is being used is written to the subject block when the CPU 7 or the flash controller 6 begins to write/read (i.e. use) the subject block. Further, a data record (referenced as record hereinafter) is first written to the data field at a top address, then to subsequent addresses.

Further, the data size of one record may be fixed, or may be variable. In the present embodiment, the data size is fixed. Further, the data size of the record is typically about several dozens bytes. Therefore, in one block scores to hundreds of records may be recordable. In FIG. 1 a block is shown as having Y number of records.

The flash controller 6 is a well-known device in the industry that performs the reading and writing of data to the flash memory 5 according to instructions provided by the CPU 7. Specifically, when the flash controller 6 receives a data read instruction from CPU 7 for reading data at a specific address, the flash controller 6 reads data contents from the specific address of the flash memory 5 to provide the data content of the specific address to CPU 7.

Further, when the flash controller 6 receives a data write instruction from CPU 7 for writing specific data to a specific address, the flash controller 6 writes the specific data to the specific address of the flash memory 5, and outputs a write-success message to CPU 7 when data writing is successful, or outputs a write-failure message to CPU 7 when data writing fails.

Further, when the flash controller 6 receives a block erasure instruction for erasing a data block, the flash controller 6 attempts to erase the entire data of the subject data block, and outputs to CPU 7 either an erasure-success message indicative of a successful data erasure or an erasure-failure message indicative of a failed data erasure.

CPU 7 realizes various processes by executing a program stored in ROM 3, and, as required in those processes, exchanges signals with outside devices through I/O 2. CPU 7 may then read data from ROM 3, and may use RAM 4 as a work area. CPU 7 may then perform data reading and data writing from and to the flash memory 5 by outputting to the flash controller 6 various instructions, as described above. For the purpose of brevity, the data reading from the flash memory 5 by the flash controller 6 under the data read instruction output from CPU 7 to the flash controller 6 is simply described as the data read from the flash memory 5 by CPU 7.

Figure 2:
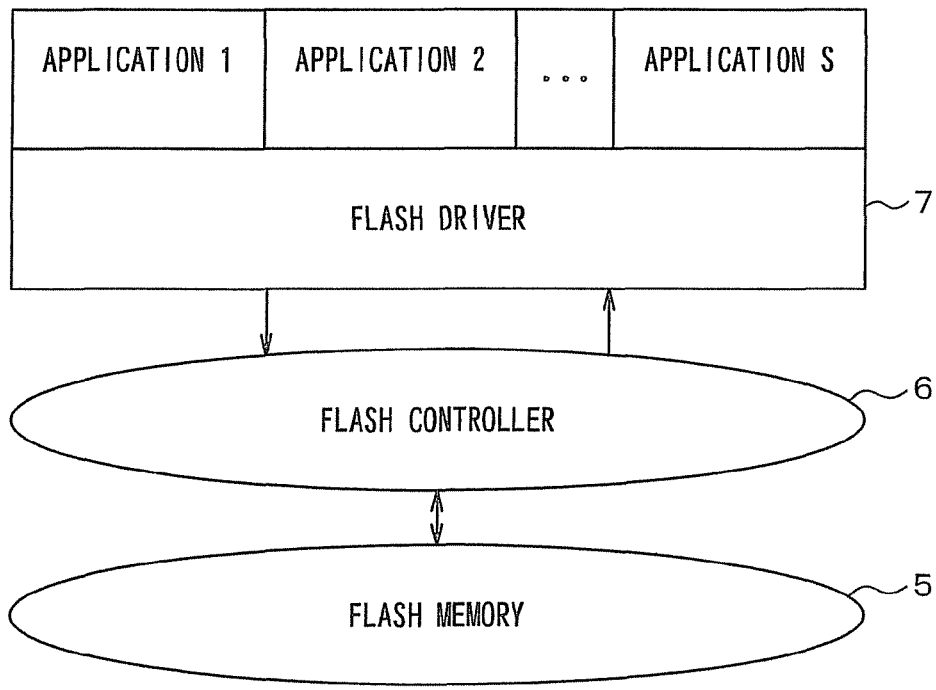
FIG. 2 is a hierarchical structure diagram of application software, a flash memory driver software, a flash memory controller, and a flash memory in the first embodiment of the present disclosure.

As shown in FIG. 1, ROM 3 stores programs (i.e., software) executed by CPU 7, such as a flash driver for driving the flash memory 5, a plurality of applications (i.e. application 1, application 2, . . . , application S). FIG. 2 provides the hierarchical structure of the programs stored in the ROM 3 together with the flash controller 6, and the flash memory 5.

CPU 7 executes the applications stored in the ROM 3. For example, the CPU 7 may execute an application for receiving a signal from a door open-close sensor through I/O 2 to detect whether the door of the vehicle is opening or closing, or for receiving a signal from an engine start detecting sensor to detect whether an engine ECU of the vehicle has started or not.

Based on the application executed by the CPU 7, data from the application may have to be recorded in the flash memory 5. For example, the number of engine starting operations for starting the engine may have to be recorded in the flash memory 5 when such number changes, or the number of times a door has opened and closed may have to be recorded to the flash memory 5 when such number changes.

As described above, when data writing is required during the execution of an application by CPU 7, a data write request for writing data from the application is provided (i.e., written) to a register of RAM 4 or CPU 7. Such data write request includes a data ID indicative of data type of the data (e.g., the number of engine starting operations, the number of times a door open/close, or the like) and a value of the data (i.e., data contents).

Then. CPU 7 starts to execute the flash driver 7 based on the output of the data write request. During the execution of the flash driver 7. CPU 7 outputs required instructions to the flash controller 6 for recording the data to the flash memory 5. Therefore, as shown in (1) and (2) of FIG. 4, the data is written to the data fields of a certain block as data records in a serially-appended manner.

In the following, for the purpose of brevity, a process of CPU 7 outputting a write instruction to the flash controller 6 for writing data to a specific address is simply described as CPU 7 writing data to a specific address of a block. Similarly, a process of CPU 7 outputting a read instruction to the flash controller 6 for reading data from a specific address and acquiring such data from the flash controller 6 is simply described as CPU 7 reading data from a specific address.

Data is sent to and recorded in a recording destination block, which satisfies a condition to be serving as the data recording destination. That is, data is recorded in a currently-written block or a next non-use block to the currently-written block when the currently-written block has no more room to write data. In other words, a non-use block that is not currently used serves as a next block.

Figure 3:
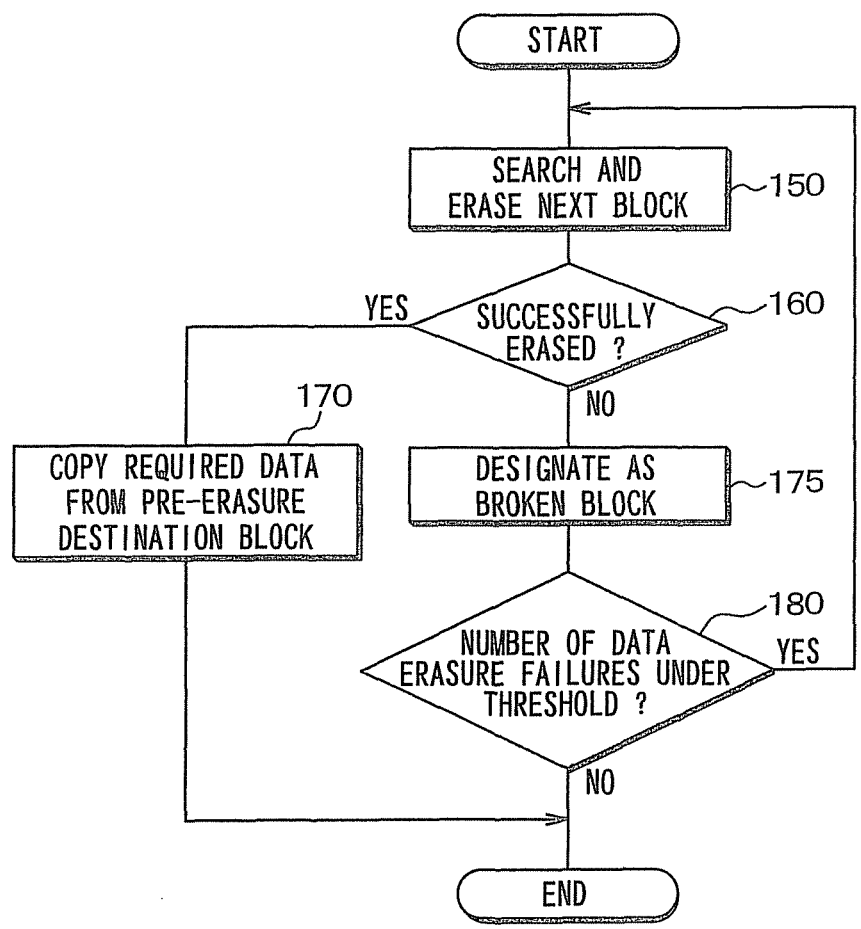
FIG. 3 is a flowchart of a process performed by CPU to write data to the flash memory in the first embodiment of the present disclosure.

A data erasure process shown in FIG. 3 is described in the following. The data erasure process is performed by CPU 7, for example, when data erasure in a certain block is required during the execution of the application.

The process, in step 150, searches for the next block according to the header field. More practically, a closest-to-top non-use block is searched for and used according to the information in the header field. The block identified in such manner (e.g., a block 2 in (3) of FIG. 4) serves as the next block. By way of example, when block 1 is full, as provided in (3) of FIG. 4, the closest-to-top non-use block is provided as block 2 (i.e., the next block).

Further, in step 150, a data erasure instruction is provided to the flash controller 6 to erase data of the next block, which needs to be erased. According to such output of the instruction, the flash controller 6 attempts to erase data in the next block. When the flash controller 6 successfully erases data, it outputs a message indicative of erasure success to CPU 7. When the flash controller 6 does not successfully erase data, it outputs a message indicative of erasure failure to CPU 7.

Then, in step 160, CPU 7 determines whether the data erasure was successful or not based on the message from the flash controller 6, and if it is successful, the process shifts to step 170.

In step 170, a used block is identified based on the header field. Further, as shown in (4) of FIG. 4, required records (i.e., a part of the entire records) are read from a previous recording destination block, and each of the read records is copied in a sequential order to the current recording destination block (e.g. the block 2 in (4) of FIG. 4) from the top address of the data field. The same scheme of starting data copy from the top address applies to the following description. Copying of data is achieved by outputting the read instruction and the write instruction to the flash controller 6 as appropriate. When data copy is finished, the process of step 170 is finished, and the data erasure process is concluded.

When the data erasure fails in step 160 (step 160: NO), CPU 7 shifts process to step 175, and the block in which the data erasure has failed is designated as a broken block. Then, CPU 7 outputs to the flash controller 6 the write instruction for writing broken block information to the header field of the broken block, which indicates that the subject block is broken.

Figure 4:
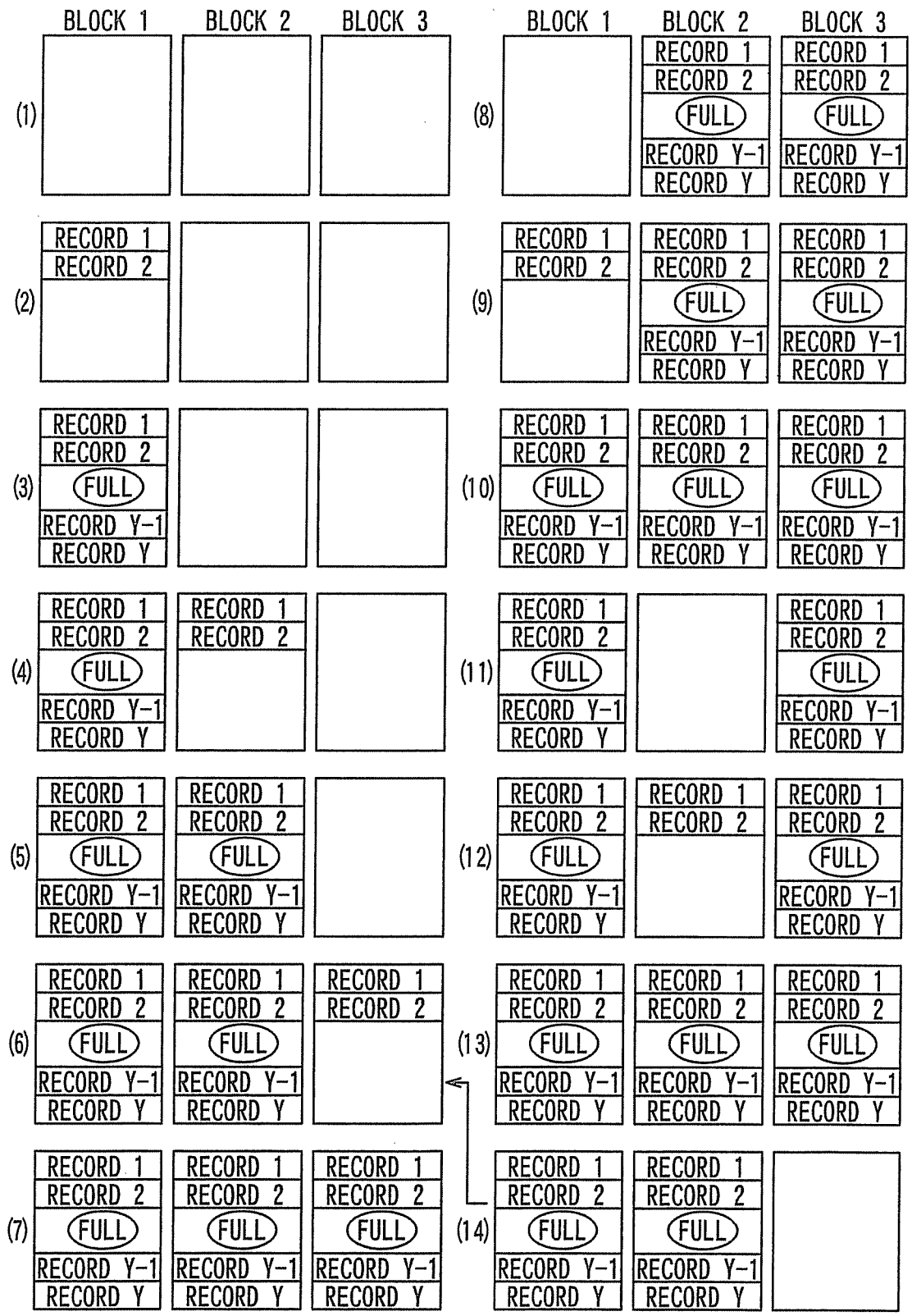
FIG. 4 is a step-by-step illustration of data record writing procedure in the first embodiment of the present disclosure.
Figure 5:
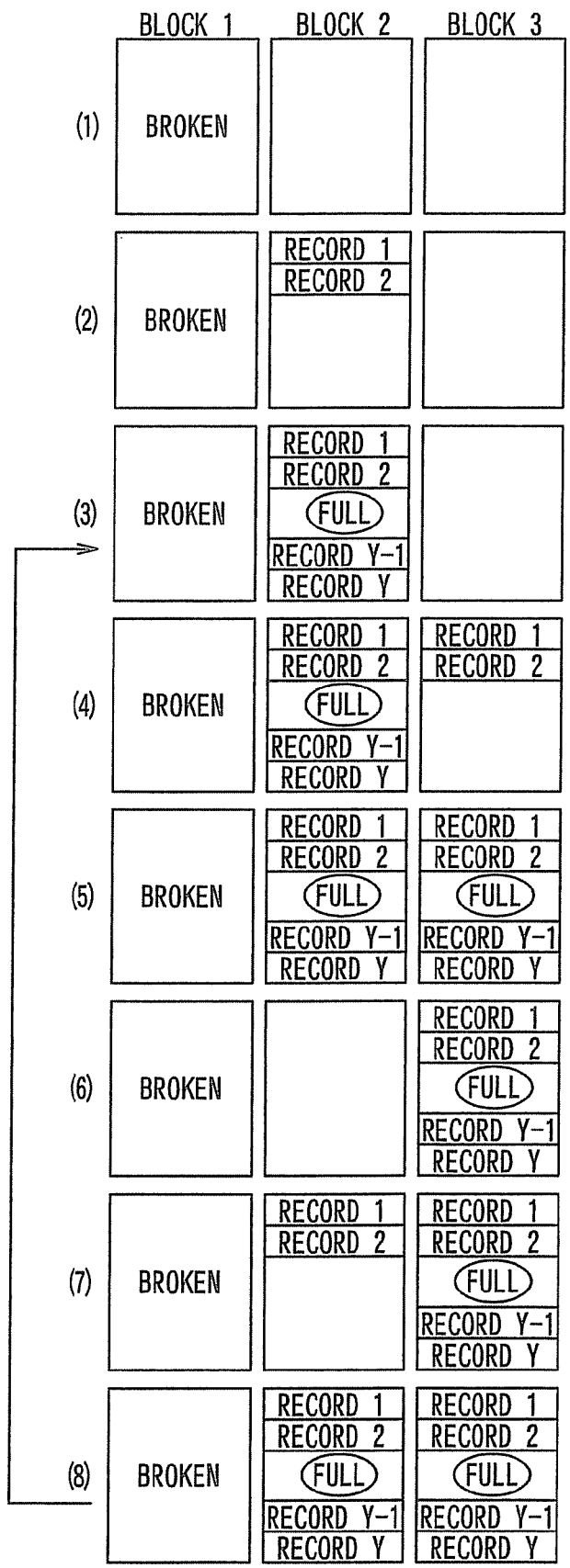
FIG. 5 is a step-by-step illustration of a procedure when a data erasure process of a block has failed in the first embodiment of the present disclosure.

For example, when the data erasure of the block 1 is attempted in step 150 as shown in (8) of FIG. 4 and failure of the data erasure is detected in step 160, the block 1 is considered as a broken block as shown in (1) of FIG. 5 and information indicative of a broken block is written to the header field of block 1. Steps (1)-(8) of FIG. 5 illustrate the step-by-step CPU 7 read/write process when a block is broken.

Then, CPU 7 shifts process to step 180, and determines whether the number of data erasure failures is within an erasure failure threshold. Such erasure failure threshold may be set to a number that is smaller by 2 counts than the number of blocks that are included in a list of usable block groups. The number of data erasure failures has an initial value of zero, and is incremented by 1 when the data erasure is determined as failed in step 160. More practically, a variable counting the number of data erasure failures is recorded in RAM 4 and the number of data erasure failures may be acquired with reference to such variable, or, alternatively, the number of data erasure failures may be acquired by counting the number of header fields that have the broken block information by using the flash controller 6.

If the number of data erasure failures is greater than (i.e. not under) the erasure failure threshold (S180: NO), an error message is output, and the process of FIG. 3 is concluded. The error message may be output to a variable storage area of RAM 4 which stores return values of applications that outputted the write request, or may be output to other devices such as an abnormality diagnosis apparatus through the I/O 2.

When the number of data erasure failures is under the threshold (S180: YES), the process returns to step 150, where the CPU 7 determines a next block after the detection of the broken block. Such a block maybe referred to as a yet-next block. In step 150, CPU 7 outputs an erase instruction to the flash controller 6 to erase data of the yet-next block, which is searched for and selected. For example, when block 1 of FIG. 5 is determined as a broken block the CPU 7 and flash controller 6 conducts a search and selects block 2 of FIG. 5 as the yet-next block. In such manner, the flash controller 6 attempts to erase data in the yet-next block. When the flash controller 6 successfully erases data in the yet-next block, it outputs a message of the data erasure success to CPU 7. When the flash controller 6 does not successfully erase data in the yet-next block, it outputs a message of the data erasure failure to CPU 7. Process in step 160 together with process in the subsequent steps after step 150 which has already been described in the above are then performed.

As described above, the next block is selected and the data erasure of the selected next block is attempted (step 150), and then whether data erasure is successful or not is determined (step 160). When the data erasure is successful, the block having the successful data erasure (i.e., the next block) is designated as a new recording destination block based on such determination, and, by reading valid records from the previous recording destination block, the read data is copied to the new recording destination block to serve as the current recording destination block (step 170).

If the data erasure failure is determined in step 160, the next block is determined as broken (step 175), and a yet-next block next to the broken block (i.e. the next block that was determined as broken) is searched for and selected and the data erasure of the yet-next block is attempted (step 150) and whether the data erasure has been successful or not is determined (step 160). If the data erasure in the yet-next block is successful, the yet-next block is designated as a new recording destination block and by reading valid records from the previous recording destination block, the read data is copied to the new recording destination block, and now serves as the current recording destination block (step 170).

As described above, the control apparatus of the present disclosure detects and designates that the next block is broken before actually writing data to the next block by checking that the result of an attempt of the data erasure in the next block has failed, and determines and designates a yet-next block that is next to the next block (i.e. block determined to be broken) as a new data recording destination by checking that the result of an attempt of the data erasure in the yet-next block is successful, thereby enabling a skip of data copy operation to the broken block. Therefore, in comparison to a defect detection scheme that only detects that a block is broken after trying to write data to the broken block a couple of times, the control apparatus of FIG. 3 detects the broken block earlier, that is, before actually writing data to the broken block. The earlier detection of the broken block can save time to copy data from the broken block to the normal block, thereby preventing an increase of the inter-block copy frequency caused by the breakage/defects of the data blocks.

Generally speaking, the electric load applied to the flash memory (5) at the time of data writing to a block is lower than the electric load of erasing data from the flash memory (5). Therefore, failure of data erasure of a certain block is a more certain indicator of a broken memory block than failure of data writing to a certain block. Based on such finding it is assumed that, even when data writing to a certain block has failed, such failure of data writing may only be caused temporarily by a minor factor, and the block may not be broken.

Therefore, in view of the above, by determining that a data recording destination block is broken when data writing to a certain block has failed, and by attempting/retrying to write data to the other parts of the same block, the usability of the block decreases. However, by immediately determining that a data recording destination block is broken when data erase of the block has failed, and by not attempting to write data to the other parts of the same broken block, the usability of the block increases with the control apparatus of the present embodiment.

Further, the number of times inter-block copying is executed does not increase, because the record will not be copied to the other block immediately after the failure of data writing to one block. Therefore, the failure of data recording will not result in the increase of the entire process time, and the process load will thus be decreased.

Second Embodiment

The second embodiment of the present disclosure is described in the following, with its focus mainly put on difference from the first embodiment.

Figure 6:
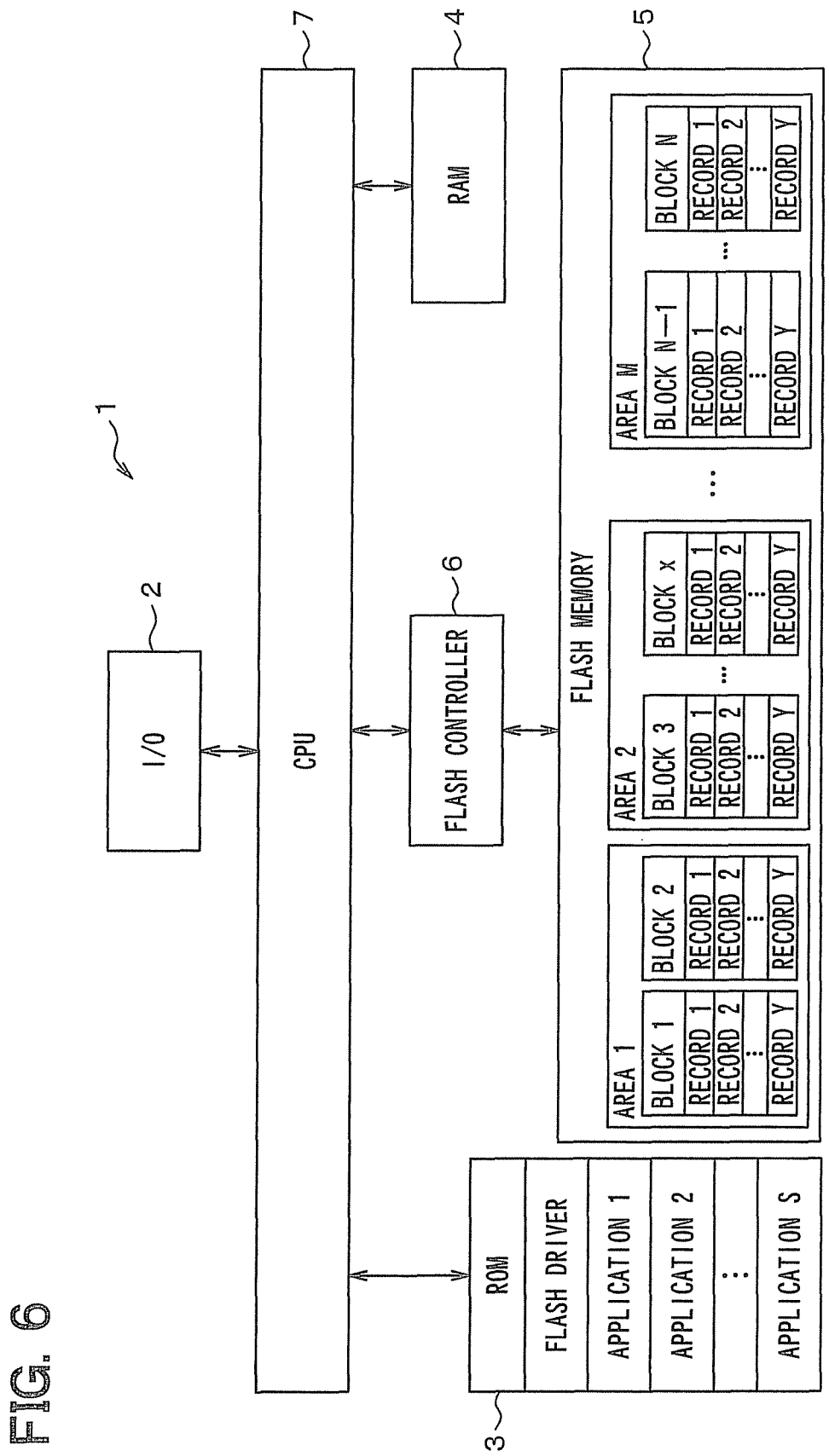
FIG. 6 is a block diagram of a microcontroller in a second embodiment of the present disclosure.

The configuration of the microcontroller 1 in the second embodiment is shown in FIG. 6. The hardware configuration of the microcontroller 1 of the present embodiment is same as the first embodiment.

However, in the present embodiment, a plurality of blocks (N pieces of blocks) in the flash memory 5 are divided into plural areas of number M, and a serial order number is assigned to each of the blocks in respective areas. The structure of the blocks and areas are stored in a non-volatile memory such as a flash memory, an EEPROM or the like. More practically, information regarding which block belongs to which area is stored as block-area relation information, or "belonging-to area data" hereinafter, in the EEPROM, which is referenced to by CPU 7 for identifying an area to which a certain block belongs.

An "area" is a domain, or a group of blocks, for classifying the recording destination of a record in the flash memory 5, according to a type of the data in the record. More practically, frequently updated data having a variable content such as a door open/close number, an engine on/off number or the like, which are frequently updated, may be stored in an area 2, and scarcely updated data having a stable content such as a software version number or the like may be stored in an area 1, after data classification according to the data type. Data type and an area number may be stored in ROM 3 as an area table showing a relation between a data ID and an area.

Further, CPU 7 of the present embodiment starts to execute the flash driver based on the write request output from the application software, and the data ID in the write request is used to refer to the area table to identify the recording destination area of the data in the write request.

Figure 7:
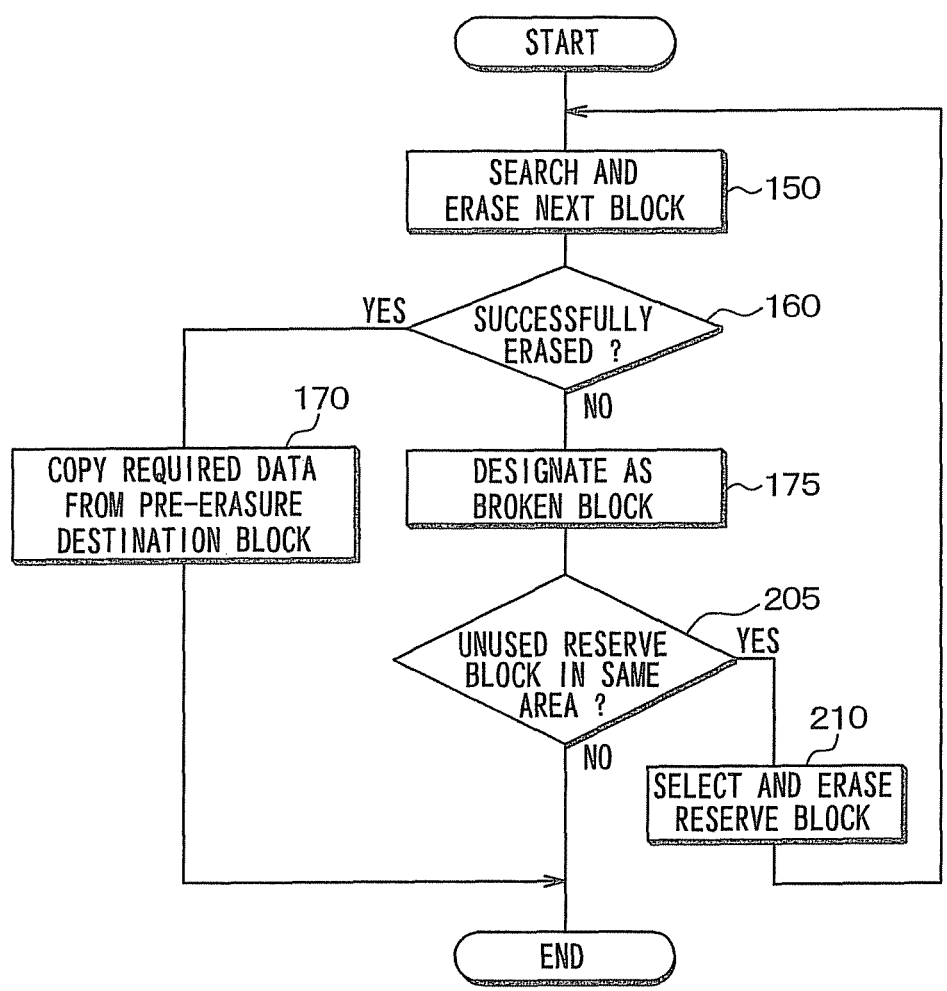
FIG. 7 is a flowchart of a process performed by CPU in the second embodiment of the present disclosure.

Then, for recording the data in the identified destination area, a process shown in FIG. 7, instead of a process in FIG. 3, is performed. The steps having the same step number have the same step process in both of FIGS. 3 and 7.

Further, at least one of the plural areas has a reserve block dedicated for the subject area, beside the blocks for data writing of a normal time. The reserve block will not be used for normal data recording. The reserve block of the subject area is prepared for use at a time of data erasure failure of the block in the subject area.

The area having the reserve block may be restricted to specific areas such as the area 2 only, or the area 2 and the area 3 only, in which data is frequently updated. In other words, other areas such as the area 1, which stores scarcely updated data, may not have a reserve block. Whether a certain area has a reserve block or not may be recognized by checking the number of assigned blocks in the subject area. That is, when the number of blocks assigned to the subject area exceeds the predetermined number of usable blocks of the subject area, the subject area has reserve block(s), by a number calculated as a difference between the predetermined number of usable blocks and the actually assigned number of blocks of the subject area. For example, if the difference between the predetermined number of usable blocks and the actually assigned number of blocks of the subject area is 1, the subject area has one reserve block, which may be the last block of the area.

The process in FIG. 7 is described in the following, in which the recording destination area is set to the area 2 that has a reserve block. Step 150 is, as already described in the first embodiment, for searching for and erasing the next block.

Further, steps 160 and 170, for checking successful data erasure and copying required data records with rewriting of the header field are also same as the first embodiment.

The difference from the first embodiment is the process after step 175, which determines that a certain block is broken, for checking whether the current recording destination area has an unused reserve block or not. That is, after data erasure of a block fails (step 160: NO) and the block is designated as broken (step 175), the process, in step 205, determines whether there is an unused reserved block.

The unused reserve block is a reserve block belonging to the same recording destination area as the block that is broken, (i.e. the block that failed data erasure). The unused reserve block also has a header field designating that the block is not used.

When it is determined that an unused reserve block is available in step 205, the unused reserve block is selected and is designated as a yet-next block in step 210. The process in step 210, provides an erase instruction to the flash controller 6 to erase the data of the yet-next block. In this manner, the flash controller 6 attempts to erase data in the yet-next block (i.e., a reserve block), and, if the data erasure is successful, the flash controller 6 provides a data erasure success message to CPU 7. If the data erasure is not successful, the flash controller 6 provides a data erasure failure message to CPU 7. The process then returns to step 160.

The process at step 160 is the same as the first embodiment. That is when the next block is successfully erased (step 160: YES) the process continues to step 170, and if the erasure is not successful (step 160: NO) the process continues to step 175.

Further, from the previous recording destination block, all of the required records are read and the read records are copied to the current recording destination block (i.e. the yet-next block; a reserve block) sequentially from a top address of the block.

Further, in step 205, when it is determined that an unused reserve block does not exist (step 205: NO), an error message is provided and the process of FIG. 7 is concluded. The error message may be provided to the same destination as the first embodiment. Further, in the present embodiment, when an area is selected as the data recording destination and the area does not have a reserve block, the process of FIG. 3 instead of FIG. 7 may be performed.

As described above. FIG. 7 illustrates a process, in which CPU 7 selects the next block, instructs the data erasure of the selected next block (step 150), determines whether data erasure is successful (step 160), and determines that the next block is broken when the data erasure is not successful (step 175). When a reserve block exists in the area of the next block that is broken (step 205), the CPU 7 selects the reserve block if it is unused (i.e. unused reserve block) as a yet-next block (i.e. unused reserved block) (step 210). The CPU 7 then instructs the flash controller to erase the yet-next block (i.e.

the unused reserved block) (step 210), and determines whether the data erasure is successful or not (step 210 and 160).

As described above, even when a certain block in an area is determined as broken, the data processing will be continued without decreasing the number of usable blocks by including (i.e., re-classifying) a reserve block, which has not been included in a usable block group so far, into a group of usable blocks, for using such block for data writing/recording. Further, the data writing is more securely performed to a less-frequently used reserve block. Further, by using (i.e., designating) one of the plural usable blocks in the recording destination block areas as the reserve block dedicated to the subject area, the reserve block is more securely reserved as a stock of available usable blocks in a certain recording destination block area.

Third Embodiment

The third embodiment of the present disclosure is described in the following, with its focus mainly put on difference from the second embodiment. In the present embodiment, a plurality of blocks N in the flash memory 5 are divided into plural areas of M, in the same manner as the second embodiment. The difference of the third embodiment is that one of the areas serves as a reserve area, where the reserve area includes a plurality of reserve blocks. The information regarding which one of the plural areas serves as the reserve area is stored in ROM 3. Further, separately from the reserve area, each of those areas may have a reserve block.

Therefore, in an area table showing a relation between a data ID and an area, no data ID is associated with the reserve area. The reserve blocks belonging to the reserve area are used as replacement blocks for blocks in other areas. The distribution of the reserve blocks in the reserve area relative to the remaining areas may be managed by using a reserve block assignment table in a flash memory. That is, the reserve block assignment table may provide a reserve block in the reserve area is used as a reserve block to be used for a particular area. For example, a reserve block 2 may be designated as a reserve bock for area 1. Further, at the time of starting the use of the microcontroller 1, each of the reserve blocks is in a condition that data in the block is erased and it is not yet determined that each of the reserve blocks is used as a replacement block of which area.

Figure 8:
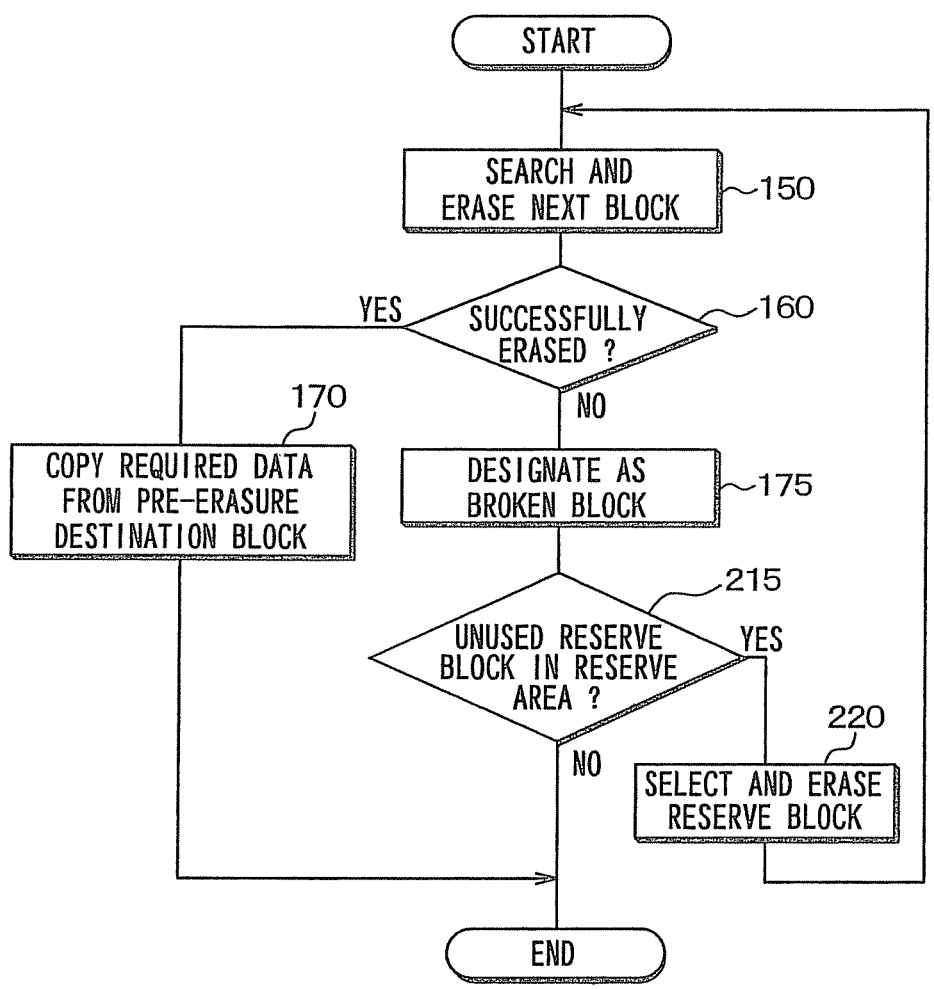
FIG. 8 is a flowchart of a process performed by CPU in the third embodiment of the present disclosure.

CPU 7 of the present embodiment is configured to perform a process shown in FIG. 8 instead of a process of FIG. 7. The steps having the same step number have the same step process in both of FIGS. 7 and 8.

The difference from the first and second embodiment is the process after step 175. That is, after data erasure failure in a block (step 160: No) and determining that the block is broken (step 170), the process in step 215 determines whether there is a unused reserve block in the reserve area.

The unused reserve block in the reserve area means that, according to the header field, a certain block among other blocks belonging to the reserve area is unused.

When it is determined that an unused reserve block exists in step 215, the process in step 220 selects, as a reserve block, one block (e.g., a closest-to-top block in the area) among other unused reserve blocks belonging to the reserve area, and records such unused reserve block as assigned to the area in which the broken block is located. For example, if the next block was in area 2, and the next block failed the erasure procedure, the next block of area 2 is designated as broken, and an unused reserve block of the reserved area is assigned to area 2.

Further, in step 220, the selected block is designated as the yet-next block, and the process outputs a data erasure instruction to the flash controller 6 to erase data of the yet-next block. According to such output of the data erasure instruction, the flash controller 6 attempts to erase data in the yet-next block (i.e., a reserve block). When the flash controller 6 successfully erases data, it outputs a message indicative of erasure success to CPU 7. When the flash controller 6 does not successfully erase data, it outputs a message indicative of erasure failure to CPU 7. Then, the process shifts to step 160. Step 160 and subsequent steps are same as the second embodiment, as already described. For example, CPU 7 determines whether the data erasure has been successful or not based on the message from the flash controller 6, and if it is successful, the process shifts to step 170, where all of the required records are read from the previous recording destination block, and the read records are copied to the current recording destination block (i.e., the yet-next block; a reserve block) sequentially from a top address of the block.

Further, when it is determined that an unused reserve block does not exists in step 215, an error message is output and the process of FIG. 8 is finished. The error message may be output to the same destination as the first embodiment.

As described above, FIG. 8 illustrates a process, in which CPU 7 selects the next block, tries the data erasure of the selected next block (step 150), determines whether data erasure is successful (step 160), determines that the next block is broken when determining that the data erasure is not successful (step 175), selects a reserve block as a yet-next block (step 220) if reserve blocks exist in the reserve area that does not belong to any other area defining a block group (step 215), attempts data erasure of the yet-next block (i.e., a reserve block) (step 150), and determines whether the data erasure is successful or not (step 160).

Further, CPU 7 performs the process of FIG. 8 regardless of what area the recording destination block area is. Therefore, the reserve blocks in the reserve area is usable as a replacement block of any area. Alternatively, the process of FIG. 8 may only be performed when one of plural specific areas is the recording destination block area, and otherwise the process of FIG. 3 may be performed. Even in such case, the reserve block in the reserve area may be used as a replacement block of any other area.

As described above, when it is determined that a certain block is broken, the data processing can be continued without decreasing the number of usable blocks in a certain area by including, in the usable block group, the reserve block that has not been included in any group of usable blocks. Further, the record writing to the reserve block is more securely performed by using a less-frequently used block as the reserve block. Further, by sharing reserve blocks as replacement blocks to replace a block of any area, the versatility of the reserve blocks are improved. In the present embodiment, any area other than the reserve area may have a reserve block, or may have no reserve block.

Fourth Embodiment

The fourth embodiment of the present disclosure is described in the following, with its focus mainly put on difference from the third embodiment. The difference of the present embodiment from the third embodiment is that, in some case, a process of FIG. 9 is performed in place of the process of FIG. 8 by CPU 7.

Further, in the present embodiment, an area ID of a least-frequently updated area is registered in ROM 3 as a replacement area ID. In other words, the data in the least-frequently updated area has a lowest update frequency, or a lowest data writing frequency among all the areas except for the reserve area.

At the time of designing the microcontroller 1, how frequently each of plural data types may be updated is roughly known. Therefore, which area has, among the areas other than the reserve area, the lowest data update frequency is known. Such information is recorded in ROM 3 as the replacement area ID. The number of blocks included in the least-frequently data updated area may be, for example, approximately two, because of the fewer number of data updates in comparison to the other areas. Such area is, in the present embodiment, defined as the area 1 that is used to record data such as the version of the software executed by the microcontroller 1.

Figure 9:
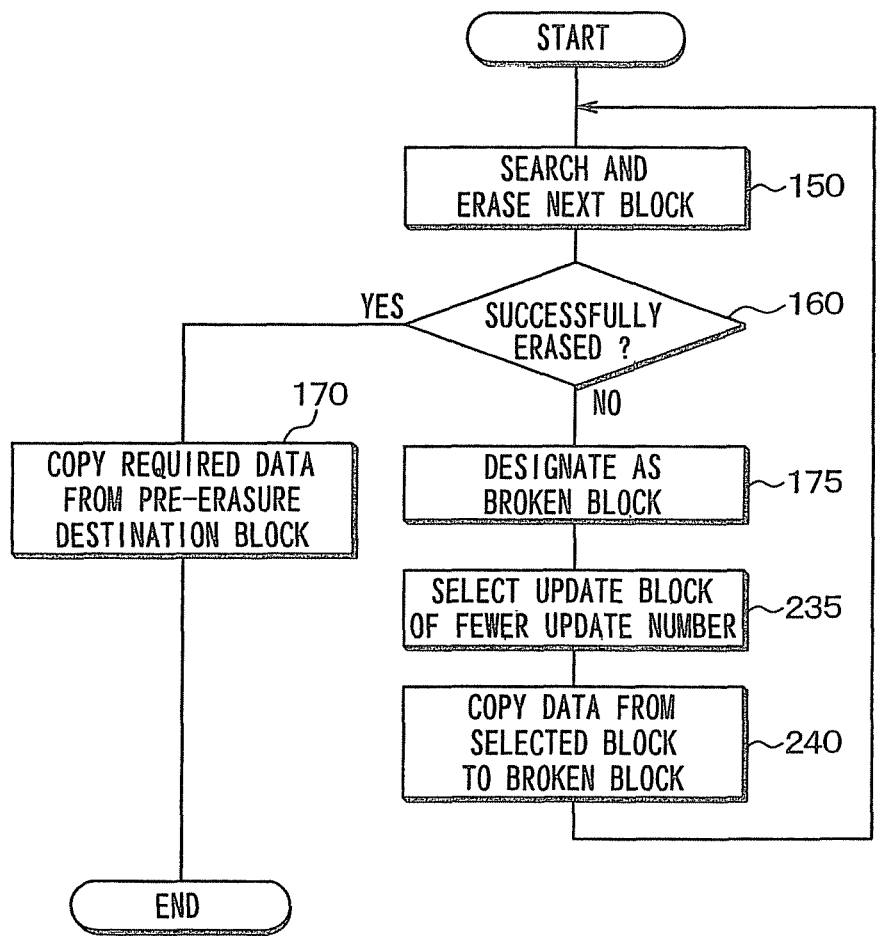
FIG. 9 is a flowchart of a process performed by CPU in the fourth embodiment of the present disclosure.

The process of FIG. 9 is described in the following. When an area other than the replacement area (e.g., the area 2) is identified as the recording destination area, CPU 7 executes the process of FIG. 9 instead of the process of FIG. 8. The difference of process of FIG. 9 from the process of FIG. 8 is replacement of steps 215 and 220 in FIG. 8 to steps 235 and 240 in FIG. 9, respectively.

In step 235 after step 175, the process searches for a block in the area 1 that is shown by the replacement area ID, and selects one from the area 1, which is hereinafter designated as the replacement area. The selected block is a block that is currently being used (i.e., currently having data writing for update) in the area 1, according to the header field. Selecting such a block is based on a reason that such a block is least likely to be broken in the replacement area, since data is actually being written to such a block.

Further, in step 235, the belonging-to area of the selected block is changed to the area 2, and the belonging-to area of the block having data erasure failure in an immediately-previous step 160 is changed to the number of the replacement area. In such manner, the selected block is excluded from a group of the usable blocks of the area 1 and is now included in a group of the usable blocks of the area 2, and the block having the data erasure failure in an immediately-previous step 160 is excluded from a group of the usable blocks of the area 2 that is currently serving as a recording destination area and is now included in a group of the usable blocks of the replacement area 1. In other words, a block is exchanged between the replacement area 1 and the current recording destination area 2.

Then, in step 240, from among the records currently recorded in the selected block, all of the effective records are copied to the block that has been determined as broken in an immediately-previous step 175.

The reason for performing the above process is that, even when a certain block is determined as "broken," such a "broken" block may still have a few usable memory areas, which is hereinafter called as "sub-blocks," to record data, and that the record in the selected block, which is a block in a least-frequently data updated area, may possibly be recorded in one of such sub-blocks in the "determined-as-broken-but-may-still-be-usable" block. In other words, because the data/record recorded in such a sub-block will not be frequently updated, such data/record do not require large memory capacity and is recordable in a small, or restricted, memory area/space in a block. Therefore, when record writing fails during copying data, record writing should be re-tried until record writing successfully finishes, in the same manner as the writing process in steps 120, 130, by skipping the address of the writing destination. After step 230, the process returns to step 150. The processes after step 150 are same as the third embodiment.

As described above, even when a block currently included in a block group serving as the recording destination block area is detected as "broken," by (i) selecting a block from the scarcely updated/recorded replacement block area which is designated as having the lowest data update/recording frequency and (ii) including such block in the recording destination block area, and by further (iii) including the "broken" block in the scarcely updated/recorded replacement block area, the frequently updated data may advantageously be recorded in a block that is less likely to be broken and that has a fewer number of data writings and/or data erasures, while the data that is required to have a relatively small memory area due to a lower update frequency may advantageously be recorded in a block that is determined as "broken," for advantageously improving the efficiency of the use of the memory blocks.

In the above embodiment, CPU 7 executing step 110 serves as an example of a full condition check unit, CPU 7 executing steps 120, 130, 140 serves as an example of a write process unit, CPU 7 executing steps 150, 160, 175, 180, 205, 210, 215, 220, 225, 230, 235, 240 serves as an example of an erase check unit, and CPU 7 executing step 170 serves as an example of an effective data copy unit.

OTHER EMBODIMENTS

Although the present disclosure has been fully described in connection with preferred embodiments thereof with reference to the accompanying drawings, it is to be noted that various changes and modifications will become apparent to those skilled in the art.

For example, in the above embodiment, each of the various functions that are realized by CPU 7 executing different programs may alternatively be realized by using hardware having respective functions (e.g., FPGA which, for example, can program a circuitry).

Further, even though the flash controller 6 and CPU 7 are separate devices in the above embodiment, a single IC may be used to realize both of the flash controller 6 and a function of CPU 7.

Further, even though I/O 2, ROM 3, RAM 4, the flash memory 5, and the flash controller 6 are disposed in one microcontroller 1 in the above embodiment, the flash memory 5 may be disposed outside of the microcontroller 1. In other words, the control apparatus of the present disclosure may include a flash memory, or may include no flash memory.

Further, even though the above embodiment describes the microcontroller 1 of in-vehicle use, as an example of the control apparatus of the present disclosure, the control apparatus of the present disclosure may have other intended use purposes, besides in-vehicle use.

Such changes, modifications, and summarized schemes are to be understood as being within the scope of the present disclosure as defined by appended claims.

What is claimed is:

1. A control apparatus that reads data from and writes data to a plurality of blocks in a flash memory, each of the blocks serving as a unit of data erasure, the control apparatus comprising:
    an erase check unit configured to (i) select a next block that is next to and different from a current data recording destination block, (ii) erase data in the next block, and (iii) determine whether data erasure in the next block has been successful or not; and
    a valid data copy unit configured to (i) designate the next block as a new data recording destination block usable for data recording, and (ii) copy a part of a plurality of data records from a previous data recording destination block to the new data recording destination block, based on a determination of the erase check unit that the data erasure in the next block is successful, wherein the erase check unit designates that the next block is broken based on a determination that the data erasure of the next block has failed, the erase check unit further searches for and selects a yet-next block next to the next block, and determines whether the data erasure in the yet-next block is successful or not after attempting the data erasure in the yet-next block, the valid data copy unit designates the yet-next block as the new data recording destination block, based on a determination of the erase check unit that the data erasure of the yet-next block is successful, the plurality of blocks are grouped into plural areas for classifying recording destinations of data records according to data types in the data records, the erase check unit selects the next block from a group of blocks belonging to the data recording destination block among the plural areas, and performs the data erasure to erase data in the next block and to determine whether the data erasure in the next block is successful, the erase check unit determines that the next block is broken when the data erasure in the next block fails, the erase check unit excludes the broken block from the group of blocks in the data recording destination block area, and the erase check unit selects the yet-next block from replacement blocks in a replacement block area which is designated as having a lowest data recording frequency among the plural block areas, includes the yet-next block in the group of blocks in the recording destination block areas, and excludes the yet-next block from a group of blocks in the replacement block area, copies a part of currently-recorded records in the yet-next block to a determined-as-broken block, includes the determined-as-broken block in the group of blocks in the replacement block area, and performs the data erasure to erase data in the yet-next block to determine whether the data erasure in the yet-next block is successful.

\* \* \* \* \*